(12) United States Patent
Wang et al.

(10) Patent No.: US 12,495,544 B2
(45) Date of Patent: Dec. 9, 2025

(54) SEMICONDUCTOR STRUCTURE AND METHOD FOR FORMING SAME

(71) Applicant: CHANGXIN MEMORY TECHNOLOGIES, INC., Hefei (CN)

(72) Inventors: Peimeng Wang, Hefei (CN); Ning Xi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 577 days.

(21) Appl. No.: 17/950,247

(22) Filed: Sep. 22, 2022

(65) Prior Publication Data
US 2023/0016457 A1 Jan. 19, 2023

Related U.S. Application Data

(63) Continuation of application No. PCT/CN2022/098720, filed on Jun. 14, 2022.

(30) Foreign Application Priority Data

May 24, 2022 (CN) .......................... 202210570430.1

(51) Int. Cl.
*H10B 12/00* (2023.01)

(52) U.S. Cl.
CPC .................. *H10B 12/50* (2023.02)

(58) Field of Classification Search
CPC .............. H10B 12/50; H01L 21/02071; H01L 21/32139; H01L 21/76834
See application file for complete search history.

(56) References Cited

U.S. PATENT DOCUMENTS

| 6,423,644 | B1 | 7/2002 | Nallan et al. |
| 6,794,304 | B1 * | 9/2004 | Gu ..................... H01L 21/76897 |
| | | | 257/E21.507 |
| 6,812,141 | B1 * | 11/2004 | Gaidis ............... H01L 21/76843 |
| | | | 257/E21.507 |
| 2022/0044941 | A1 * | 2/2022 | Liao ................... H01L 21/76832 |

FOREIGN PATENT DOCUMENTS

CN        1441959 A        9/2003

* cited by examiner

*Primary Examiner* — Marlon T Fletcher
*Assistant Examiner* — Samuel Jonathan Smith
(74) *Attorney, Agent, or Firm* — Syncoda LLC; Feng Ma

(57) ABSTRACT

A semiconductor structure formed by the method for forming the semiconductor structure includes: a substrate, on which an insulating layer is formed; metal conductive layers located on the insulating layer; and an isolation structure located between two adjacent ones of the metal conductive layers.

12 Claims, 19 Drawing Sheets

```
┌─────────────────────────────────────────────────────┐
│ A substrate is provided, on which an insulating    │
│ layer, an initial metal conductive layer, an       │── S101
│ initial protective layer and a mask layer stacked  │
│ in sequence are formed, in which the initial       │
│ protective layer includes a nitrogen silicon       │
│ compound layer                                      │
└─────────────────────────────────────────────────────┘
                          ↓
┌─────────────────────────────────────────────────────┐
│ Based on the patterned mask layer, the initial     │── S102
│ protective layer and the initial metal conductive  │
│ layer are etched by using an oxygen source gas as  │
│ an etching gas to form metal conductive layers and │
│ protective layers located on the metal conductive  │
│ layers                                              │
└─────────────────────────────────────────────────────┘
                          ↓
┌─────────────────────────────────────────────────────┐
│ The patterned mask layer is ashed by using an      │── S103
│ oxygen source gas as an etching gas to remove the  │
│ patterned mask layer                                │
└─────────────────────────────────────────────────────┘
                          ↓
┌─────────────────────────────────────────────────────┐
│ The by-product formed during the etching and       │── S104
│ ashing processes is cleaned with an alkaline       │
│ corrosive liquid to expose the protective layers   │
└─────────────────────────────────────────────────────┘
                          ↓
┌─────────────────────────────────────────────────────┐
│ An isolation structure is formed between two       │── S105
│ adjacent ones of the metal conductive layers       │
└─────────────────────────────────────────────────────┘
```

SEMICONDUCTOR STRUCTURE AND METHOD FOR FORMING SAME

CROSS-REFERENCE TO RELATED APPLICATIONS

The present application is a U.S. continuation application of International Application No. PCT/CN2022/098720, filed on Jun. 14, 2022, which claims priority to Chinese Patent Application No. 202210570430.1, filed on May 24, 2022. International Application No. PCT/CN2022/098720 and Chinese Patent Application No. 202210570430.1 are incorporated herein by reference in their entireties.

BACKGROUND

In a process of manufacturing memory elements, a semiconductor structure is usually divided into an array region and a peripheral region. The array area includes a storage area transistor, a capacitor structure, and a landing pad between the two; and the peripheral area includes a circuit for controlling data input/output and other circuits, and in order to input or output data, a metal conductive layer needs to be formed in the peripheral area. However, when the metal conductive layer is formed, part of by-products are prone to remain by the metal conductive layer during a process, and the by-products include multiple substances and are prone to cause short circuits between adjacent metal conductive layers. Therefore, there is a need to provide a new method for forming the metal conductive layer so that a composition of the residual by-products is simpler and short circuits between adjacent metal conductive layers can be reduced.

SUMMARY

In view of this, embodiments of the disclosure provide a semiconductor structure and a method for forming the same.

In a first aspect, embodiments of the disclosure provide a method for forming a semiconductor structure, the method includes: providing a substrate, on which an insulating layer, an initial metal conductive layer, an initial protective layer and a mask layer stacked in sequence are formed, in which the initial protective layer includes a silicon nitrogen compound layer; based on a patterned mask layer, etching the initial protective layer and the initial metal conductive layer by using an oxygen source gas as an etching gas to form metal conductive layers and protective layers located on the metal conductive layers; ashing the patterned mask layer by using an oxygen source gas as an etching gas to remove the patterned mask layer; cleaning out a by-product formed during the etching and the ashing process by using an alkaline corrosive liquid to expose the protective layers; and forming an isolation structure between two adjacent ones of the metal conductive layers.

In a second aspect, embodiments of the present disclosure also provide a semiconductor structure formed by the method described in the first aspect, including: a substrate, in which an insulating layer is formed on the substrate; metal conductive layers located on the insulating layer; and an isolation structure located between two adjacent ones of the metal conductive layers.

BRIEF DESCRIPTION OF THE DRAWINGS

In the drawings (which are not necessarily drawn to scale), similar reference numerals may describe similar parts in different views. Similar reference numerals with different letter suffixes may represent different examples of similar parts. The various embodiments discussed herein are generally shown in the accompanying drawings by way of example, but not limitation.

DETAILED DESCRIPTION

Figure 1:
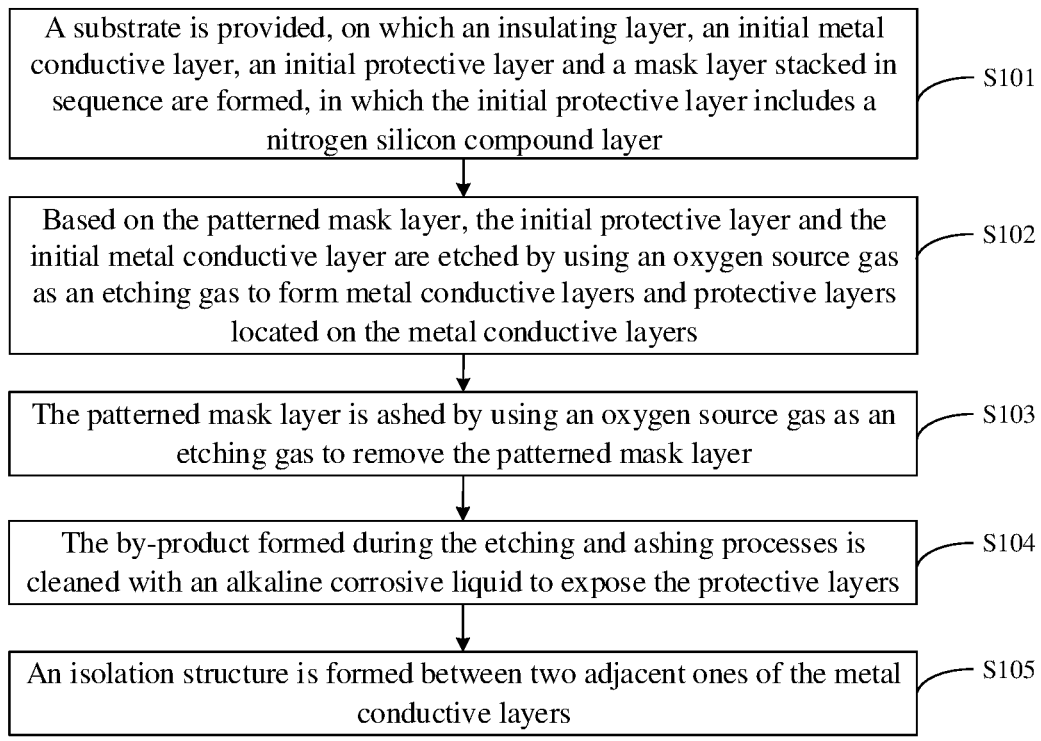
FIG. 1 is a schematic flowchart for achieving a method for forming a semiconductor structure provided by embodiments of the disclosure.

The disclosure relates to the technical field of semiconductor technologies, and relates to, but is not limited to, a semiconductor structure and a method for forming the same.

Exemplary embodiments of the present disclosure will be described in more detail below with reference to the accompanying drawings. While exemplary embodiments of the present disclosure are shown in the drawings it should be understood that the present disclosure may be implemented in various forms and should not be limited by the specific embodiments set forth herein. In contrast, these embodiments are provided to enable a more thorough understanding of the disclosure and to fully convey the scope of the disclosure to a person skilled in the art.

In the following description, numerous specific details are set forth in order to provide the more thorough understanding of the disclosure. However, it is apparent to a person skilled in the art that the disclosure may be implemented without one or more of these details. In other embodiments, in order to avoid confusion with the disclosure, some technical features known in the art are not described. That is, not all features of actual embodiments are described herein, and well-known functions and constructions are not described in detail.

In the drawings, the dimensions of a layer, a region, an element or their relative dimensions may be magnified for clarity. The same reference numeral indicates the same element throughout.

It should be understood that while the element or the layer is referred to as being "on . . . ", "adjacent to . . . ", "connected to . . . " or "coupled to . . . " other elements or layers, it may be directly on the other elements or layers, adjacent to, connected or coupled to the other elements or layers, or an intermediate element or layer may be present. In contrast, while the element is referred to as being "directly on . . . ", "directly adjacent to . . . ", "directly connected to . . . " or "directly coupled to . . . " other elements or layers, the intermediate element or layer is not present. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily present in the disclosure.

The terms used here are only intended to describe the specific embodiments and are not limitations to the disclosure. As used here, singular forms of "a", "an" and "said/the" are also intended to include plural forms, unless otherwise clearly indicated in the context. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, a term "and/or" includes any and all combinations of related items listed.

Embodiments of the present disclosure provide a method for forming a semiconductor structure. Referring to FIG. 1, the method includes S101 to S105, in which:

At S101, a substrate is provided, on which an insulating layer, an initial metal conductive layer, an initial protective layer and a mask layer stacked in sequence are provided. The initial protective layer includes a nitrogen silicon compound layer.

The substrate may be a silicon substrate, a silicon-on-insulator substrate, or the like. The substrate may also include other semiconductor elements or semiconductor compounds, for example, silicon carbide (SiC), gallium arsenide (GaAs), gallium phosphide (GaP), indium phosphide (InP), indium arsenide (InAs), indium antimonide (InSb), or other semiconductor alloys, for example, gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or combinations thereof.

A material used for the insulating layer may be at least one of an oxide of silicon, a nitridosilicate, a silicon nitrogen oxide, a silicon-carbon oxide, a borosilicate glass, a phosphorosilicate glass or a boron-phosphorosilicate glass. The insulating layer may be formed by a chemical vapor deposition process, a physical vapor deposition process, an atomic layer deposition process or other processes.

A material used for the initial metal conductive layer may be at least one of tungsten (W), tantalum (Ta) or titanium (Ti).

The role of the initial protective layer may be to protect the initial metal conductive layer from damage in subsequent processes. The material of the initial protective layer may be nitrogen silicon compounds such as silicon nitride and silicon oxynitride.

Specific part of the mask layer can be converted into a patterned mask layer in the subsequent process. The mask layer may be a double-layer structure, even a multi-layer structure, but also a single-layer structure. The mask layer of an upper layer of the double-layer or multi-layer structure can protect the mask layer of lower layer(s), which can reduce damage to the mask layer of the lower layer(s) in the subsequent process, thereby reducing defects of the patterned mask layer, and further improving the pattern transfer effect. The material used for the mask layer may be at least one of silicon oxide, silicon nitride, silicon carbide, silicon oxynitride, amorphous carbon, polysilicon, hafnium oxide, titanium oxide, zirconia, titanium nitride, or tantalum nitride. The mask layer may be formed by any of the following processes: a chemical vapor deposition process, a physical vapor deposition process, an atomic layer deposition process, a spin-on process, or any other suitable process. The type of the mask layer and layer(s) thereof are not limited in the embodiments of the disclosure.

In some embodiments, a photoresist layer and an anti-reflective layer may also be provided on the mask layer. During implementation, the photoresist layer may be performed with exposure, development, cleaning or the like, and the anti-reflective layer and the mask layer are etched by utilizing retained part of the photoresist layer, and part protected by the photoresist is retained to form the patterned mask layer. In this way, an accuracy of pattern formation in the mask layer can be improved, thereby improving the yield of semiconductor devices.

At S102, based on the patterned mask layer, the initial protective layer and the initial metal conductive layer are etched by using an oxygen source gas as an etching gas to form metal conductive layers and protective layers located on the metal conductive layers.

Here the oxygen source gas may include oxygen and/or ozone, or the like. During implementation, the oxygen source gas may be excited under a radio-frequency power to generate ionization and form plasma, and under impacts of electrons, the gas in a reaction chamber not only transforms into ions, but also absorbs energy and forms a large number of active reaction groups. A chemical reaction occurs between the active reaction groups and the surface of the etched substance (including the initial protective layer and the initial metal conductive layer), and a volatile reaction product is formed; after that, the reaction product is separated from the surface of the etched substance and is extracted from the reaction chamber by a vacuum system, thereby forming the desired patterned metal conductive layers and protective layers on the metal conductive layers.

At S103, the patterned mask layer is ashed by using an oxygen source gas as an etching gas, to remove the patterned mask layer.

Here the oxygen source gas may include oxygen and/or ozone, or the like. The ashing refers to the removal of residual photoresist, patterned mask layer or other organic matter.

When the patterned mask layer is removed through ashing by using a nitrogen source gas as an etching gas, nitrogen and the metal conductive layer would form a by-product, i.e. a metal nitride, for example, tungsten nitride. Because the produced tungsten nitride is difficult to remove and by-products formed during the ashing and etching processes are different, it is necessary to use different solutions to remove the by-products formed during the ashing and etching processes. In addition, the residual tungsten nitride would move to located position between adjacent metal conductive layers in the subsequent cleaning process of the metal conductive layers, thus connecting the adjacent metal conductive layers, resulting in short circuit between the adjacent metal conductive layers. Therefore, it needs to use a nitrogen-free gas, for example, the oxygen source gas during the ashing. In this way, on the one hand, the by-product formed in the ashing and etching processes can be removed at one time with an solution, which simplifies the process flow; on the other hand, since no metal nitride is formed, it is possible to reduce conditions in which short circuits occur between adjacent conductive layers.

At S104, the by-product formed during etching and ashing processes are cleaned out with an alkaline corrosive liquid to expose the protective layers.

The alkaline corrosive liquid may include a base having a pKb of less than or equal to about 5, less than or equal to about 4.8, less than or equal to about 4.75, less than or equal to about 4.7, less than or equal to about 4.5, less than or equal to about 3, less than or equal to about 2, or less than or equal to about 1. In some embodiments, the base may include an organic base such as a hydroxide of pyridine, methylamine, midazole or an organic cation. In some embodiments, the base may include a basic salt such as sodium carbonate, sodium acetate, or a compound with a weak acid component that hydrolyzes to form an alkaline solution. In some embodiments, the base may include an alkali metal. In some embodiments, the base may include hydroxide ions. In some embodiments, the base may include at least one of sodium hydroxide (NaOH), potassium hydroxide (KOH) or ammonium hydroxide ($NH_4OH$).

The alkaline corrosive liquid in the embodiments of the disclosure may include an ammonia diw mixture (ADM) solution, in which a volume ratio of ammonia to deionized water ranges from 5:1 to 1000:1.

The by-product formed during the etching and ashing processes may include an oxide of tungsten $W_xO_y$, in which x may be equal to 1 and y may be equal to 3, the oxide of tungsten is tungsten trioxide. The reaction of Formula (1) can occur between the ADM and the by-product, in which the tungsten oxide $W_xO_y$ reacts with ammonium hydroxide to form ammonium tungstate, which can be dissolved in water to remove the by-product; moreover, the ADM does not react with the metal conductive layers, so damage to the metal conductive layer can be reduced.

$$W_xO_y + NH_4OH \rightarrow (NH_4)_6W_7O_{24} \cdot 6H_2O \qquad \text{Formula (1)}$$

At S105, an isolation structure is formed between adjacent metal conductive layers.

The isolation structure is used for isolating the two adjacent ones of the metal conductive layers to further reduce the short circuit between the adjacent metal conductive layers.

In the embodiments of the disclosure, firstly, the insulating layer, the initial metal conductive layer, the initial protective layer and the mask layer stacked in sequence are formed on the substrate, in which the initial protective layer includes the nitrogen silicon compound layer, and the initial protective layer can protect the initial metal conductive layer to reduce damage to the initial metal conductive layer when the patterned mask layer is subsequently removed; secondly, based on the patterned mask layer, the initial protective layer and the initial metal conductive layer are etched by using the oxygen source gas the etching gas, in this way, the required patterned metal conductive layers and the protective layers located on the metal conductive layers can be obtained, and so that the by-product formed during the etching process mainly include a metal oxide; thirdly, in the process that the patterned mask layer removed through ashing by using the oxygen source gas as the etching gas, the oxygen source gas further makes the by-product formed in the ashing process mainly include a metal oxide; moreover, the alkaline corrosive liquid is used for cleaning to remove the by-product formed during the etching and ashing processes and to expose the protective layer, in this way, because the alkaline corrosive liquid would react with the by-product and does not react with the metal conductive layers, so that damage to the metal conductive layers would be reduced, and because the by-product formed during the etching and ashing processes mainly include the metal oxide, the by-product can be removed at one time with an solution, thus the process flow can be simplified; finally, the isolation structure is formed between the adjacent metal conductive layers, which can further reduce short circuit between the adjacent metal conductive layers.

S101 to S105 are further illustrated below with reference to FIGS. 2A to 2E.

Figure 2A:
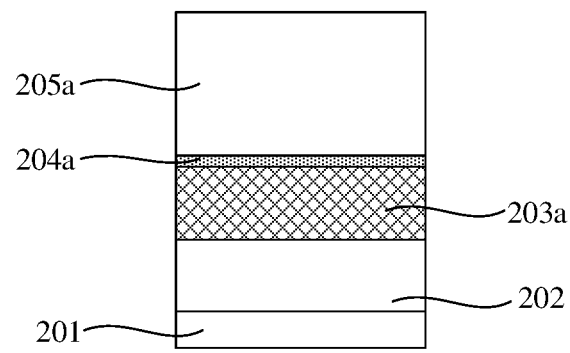
FIG. 2A is a schematic structural diagram of a semiconductor structure in a forming process provided by embodiments of the disclosure.

Referring to FIG. 2A, an insulating layer 202, an initial metal conductive layer 203a, an initial protective layer 204a and a mask layer 205a stacked in sequence are formed on a substrate 201, in which the initial protective layer 204a includes a nitrogen silicon compound layer.

Figure 2B:
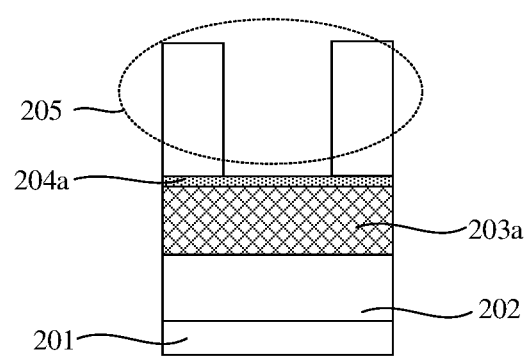
FIG. 2B is a schematic structural diagram of a semiconductor structure in a forming process provided by embodiments of the disclosure.

Referring to FIG. 2B, a patterned mask layer 205 is formed on the initial protective layer 204a. It can be seen that the patterned mask layer 205 exposes part of the initial protective layer 204a and defines a position for subsequent etching.

Figure 2C:
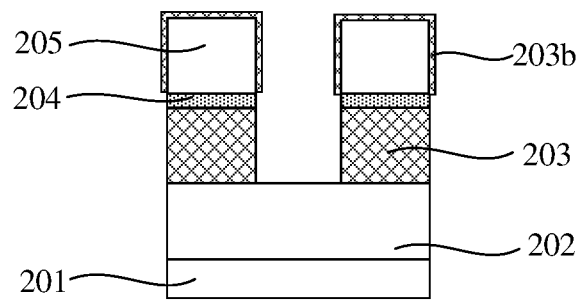
FIG. 2C is a schematic structural diagram of a semiconductor structure in a forming process provided by embodiments of the disclosure.

Referring to both FIG. 2B and FIG. 2C, based on the patterned mask layer 205, the initial protective layer 204a and the initial metal conductive layer 203a are etched by using an oxygen source gas as an etching gas to form metal conductive layers 203 and protective layers 204 located on the metal conductive layers 203. Since part of the patterned mask layer 205 is consumed during the etching process, it can be found that the patterned mask layer 205 in FIG. 2C is shorter than the patterned mask layer 205 in FIG. 2B.

During implementation, referring to FIG. 2C, in the etching process, part of initial metal conductive layer 203b etched away would redeposit on an upper surface and sidewalls of the patterned mask layer 205, and part of the initial metal conductive layer 203b would be oxidized to a metal oxide (for example, tungsten oxide) as a by-product formed during the etching process, and part of the initial metal conductive layer 203b that is not oxidized during the etching process would be further oxidized during an ashing process to become a by-product of the ashing process.

Figure 2D:
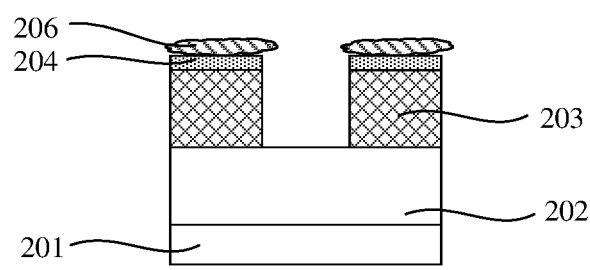
FIG. 2D is a schematic structural diagram of a semiconductor structure in a forming process provided by embodiments of the disclosure.

Referring to both FIG. 2C and FIG. 2D, ashing is performed by using an oxygen source gas as an etching gas to remove the patterned mask layer 205 and form a by-product 206 on the protective layers 204. During implementation, the by-product 206 may also be located between adjacent metal conductive layers 203.

Figure 2E:
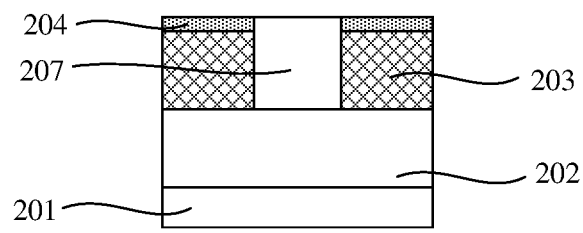
FIG. 2E is a schematic structural diagram of a semiconductor structure in a forming process provided by embodiments of the disclosure.

Referring to both FIG. 2D and FIG. 2E, cleaning is performed by using an alkaline corrosive liquid to remove the by-product 206 formed during the etching and ashing processes to expose the protective layers 204 and form an isolation structure 207 between adjacent metal conductive layers 203.

In some embodiments, depending on an etching rate and an etching depth, an etching time during which the initial metal conductive layer 203a is etched through and the insulating layer 202 is not etched can be obtained. Based on the etching time, a structure as shown in FIG. 2C can be resulted by etching. In some other embodiments, part of the insulating layer may be etched (i.e., over-etching) in the etching regardless of the etching time, and the insulating layer is taken as the etching stop layer, thus the process flow can be simplified.

Based on the method for forming a semiconductor structure provided in S101 to S105, embodiments of the disclosure provide a semiconductor structure, referring to FIG. 2E, the semiconductor structure includes:

a substrate 201, on which an insulating layer 202 is formed;

metal conductive layers 203 located on the insulating layer 202, in which a metal conductive layer includes a tungsten layer.

An isolation structure 207 is located between adjacent metal conductive layers 203.

In the embodiments of the disclosure, the semiconductor structure formed by the above method includes a substrate, the insulating layer located on the substrate and the metal conductive layers, and the isolation structure between the metal conductive layers. On the one hand, when the semiconductor structure is formed, a by-product located between or on adjacent metal conductive layers can be removed by using one solution, therefore, the flow of forming the semiconductor structure is relatively simple and the yield of formed semiconductor structures is relatively high; on the other hand, in the process of forming the semiconductor structure, since the protective layers would protect the metal conductive layers, damage to the metal conductive layers caused by ashing can be reduced, in other words, the metal conductive layers in the semiconductor structure are relatively complete, thereby improving the performance of a metal conductive layer.

In some embodiments, referring to FIG. 2E, the isolation structure 207 may include the protective layers 204 located on the metal conductive layers 203.

In some embodiments, a of the operation that an initial protective layer is formed may include S11 to S12, in which:

At S11, an initial metal conductive layer is planarized.

Figure 3A:
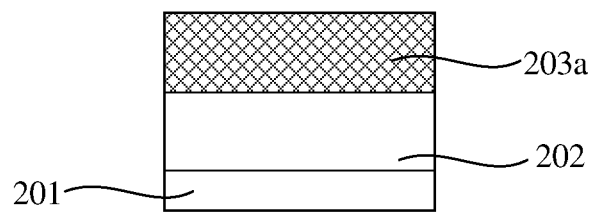
FIG. 3A is a schematic structural diagram of a semiconductor structure in a forming process provided by embodiments of the disclosure.

Referring to FIG. 3A, the initial metal conductive layer 203a is planarized by a chemical mechanical polishing (CMP) process to obtain a flat surface without scratches and impurity contaminations, which is beneficial to improving the flatness and quality of the initial protective layer formed subsequently.

At S12, the initial protective layer is formed on the initial metal conductive layer after the planarization. A process for forming the initial protective layer includes at least one of an atomic layer deposition process, a low-pressure chemical vapor deposition process, or a plasma enhanced chemical vapor deposition process. The material of the initial metal conductive layer and the metal conductive layers includes tungsten, and the material of the initial protective layer and the protective layers includes at least one of silicon nitride or silicon oxynitride.

Figure 3B:
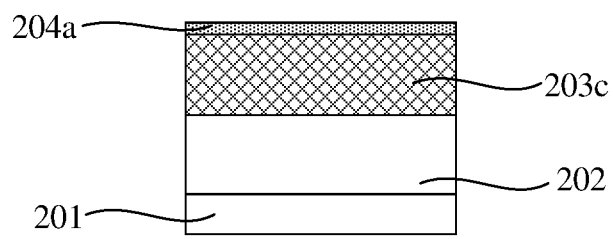
FIG. 3B is a schematic structural diagram of a semiconductor structure in a forming process provided by embodiments of the disclosure.

Referring to FIG. 3B, after the planarization by atomic layer deposition process or others, the initial protective layer 204a is formed on the initial metal conductive layer 203c.

In the embodiments of the disclosure, since the atomic layer deposition process is a process in which monoatomic layers are deposited in sequence, the initial protective layer with uniform thickness and good consistency can be formed. Due to that the low-pressure chemical vapor deposition process requires the pressure in a reactor to decrease until below a certain value (for example, 133 Pa), the free path of molecules and the diffusion coefficient of a gas would increase, thus accelerating the mass transfer rate of gaseous reactants and by-product, and finally the reaction rate of forming the initial protective layer is increased; moreover, a carrier gas is not needed in the low-pressure chemical vapor deposition process, so particle pollution sources can be greatly reduced. Due to that a deposition temperature required by the plasma enhanced chemical vapor deposition process is low, influence on a structure and physical properties of the initial metal conductive layer can be reduced. In addition, the initial protective layer formed by the plasma enhanced chemical vapor deposition process has good uniformity and few pinholes, and is dense.

During implementation, silicon oxynitride may be either oxygen-rich silicon oxynitride or silicon-rich silicon oxynitride. Compared with ordinary silicon oxynitride, advantages of using silicon-rich silicon oxynitride include: on the one hand, a residual tensile stress of a silicon-rich silicon oxynitride layer is small, so that a thicker layer can be formed, thereby enhancing protection on the initial metal conductive layer; on the other hand, silicon-rich silicon oxynitride layer can reduce an etching rate of an acid corrosive liquid (for example, a diluted hydrofluoric acid solution), retaining part of the silicon-rich silicon oxynitride layer, so that residual impurities can be further removed in the subsequent process.

In some embodiments, a mask layer includes an amorphous carbon layer, and S102 "based on the patterned mask layer, the initial protective layer and the initial metal conductive layer are etched by using an oxygen source gas as an etching gas to form metal conductive layers and protective layers located on the metal conductive layers" may include S1021 and S1022, in which:

At S1021, a patterned amorphous carbon layer is formed on the initial protective layer.

At S1022, based on the patterned amorphous carbon layer, the initial protective layer and the initial metal conductive layer are etched by an in-situ oxygen plasma etching process to form the metal conductive layers and the protective layers located on the metal conductive layers.

Correspondingly, S103 "the patterned mask layer is ashed by using an oxygen source gas as an etching gas, to remove the patterned mask layer" may include S1031.

At S1031, the patterned amorphous carbon layer is ashed by using oxygen plasma, to remove the patterned amorphous carbon layer.

In the embodiments of the present disclosure, the mask layer includes the amorphous carbon layer, and during the in-situ oxygen plasma etching process, the oxygen plasma would react with amorphous carbon to produce carbon dioxide, so that part of the patterned amorphous carbon layer can be removed; and compared with the metal conductive layers and the protective layers, amorphous carbon has a higher etch selection ratio, so it can reduce the damage to the metal conductive layers in the subsequent ashing process using the oxygen source gas as the etching gas.

In some embodiments, before S104 "the by-product formed during etching and ashing processes are cleaned out with an alkaline corrosive liquid to expose the protective layers", S1040 may be included, in which surfaces of the protective layers are pretreated to remove natural oxides on the protective layers and expose the protective layers and the by-product formed during the etching and ashing processes.

The operation that surfaces of the protective layers are pretreated may include: wetting the surfaces of the protective layers and cleaning the surfaces of the protective layers with a small amount of a diluted hydrofluoric acid (DHF) solution. In this way, the natural oxides and part of tiny dust impurity particles on the protective layers can be removed, thereby exposing the protective layers and the by-product formed during the etching and ashing processes, which is beneficial to subsequently remove the by-product.

In some embodiments, S105 "an isolation structure is formed between adjacent metal conductive layers" may include S1051a, in which first dielectric layers and a second dielectric layer are formed in sequence between the metal conductive layers and on top surfaces of the protective layers. The protective layers, the first dielectric layers and the second dielectric layer together constitute the isolation structure.

The first dielectric layer may be made of silicon nitride, silicon oxide or other insulating materials, and the second dielectric layer may be made of silicon nitride or silicon oxide doped with impurities (for example, fluorine, carbon or boron), and doped impurity ions can reduce the dielectric constant of silicon nitride or silicon oxide, so that parasitic capacitance between metal conductive layers is reduced, thereby reducing the power consumption of a device.

The first dielectric layer may be formed by a chemical vapor deposition process, a physical vapor deposition process, an atomic layer deposition process, a low-pressure chemical vapor deposition process, a plasma enhanced chemical vapor deposition process, a spin-on process, or any other suitable process. The second dielectric layer may be formed as follows: a dielectric layer is formed by a chemical vapor deposition process, then impurity ions are doped in the dielectric layer by an ion doping process, and finally the dielectric layer doped the impurity ions is annealed, thereby obtaining the second dielectric layer.

Figure 4A:
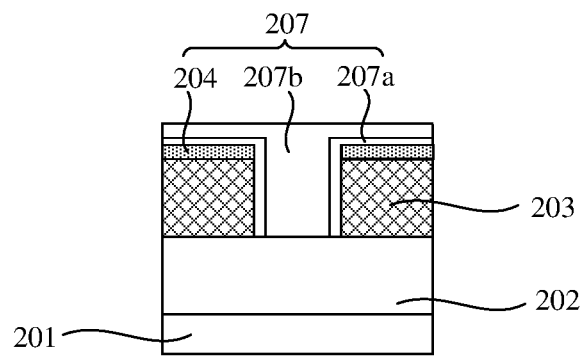
FIG. 4A is a schematic structural diagram of a semiconductor structure in a forming process provided by embodiments of the disclosure.

Referring to FIG. 4A, the first dielectric layers 207a and the second dielectric layer 207b are formed in sequence between the adjacent metal conductive layers and on the top surfaces of the protective layers to form the isolation structure 207. The isolation structure 207 may include the protective layers 204 the first dielectric layers 207a and the second dielectric layer 207b.

Figure 4B:
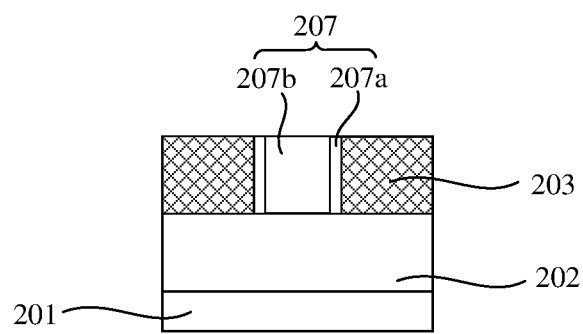
FIG. 4B is a schematic structural diagram of a semiconductor structure in a forming process provided by embodiments of the disclosure.

Referring to FIG. 4B, when other metal contact structures are to be subsequently formed on the metal conductive layers 203, the isolation structure 207 on the metal conductive layers 203 may be removed, and part of the first dielectric layer 207a and the second dielectric layer 207b which are located between the adjacent metal conductive layers 203 may be retained to expose upper surfaces of the metal conductive layers 203, so that the metal contact structures can be electrically connected with the metal conductive layers 203.

In some embodiments, S105 "an isolation structure is formed between adjacent metal conductive layers" may include S1051b and S1052b.

At S1051b, the protective layers are corroded with an acid corrosive liquid to remove part of each protective layer.

The acid corrosive liquid may include a diluted hydrofluoric acid solution, a hot phosphoric acid solution, a nitric acid solution, etc. A volume ratio of hydrogen fluoride to deionized water in the diluted hydrofluoric acid solution ranges from 10:1 to 1000:1. In this way, by setting the volume ratio of hydrogen fluoride to deionized water in the diluted hydrofluoric acid solution, a rate of removing the protective layers can be increased.

There are two main purposes for removing the part of each protective layer: on the one hand, there may be by-product impurities on surfaces of the exposed protective layers, these by-product impurities can be removed while removing the part of each protective layer; on the other hand, polymer may adhere back to the surfaces of the protective layers, and the polymer adhering back to the protective layers can be removed while removing the part of each protective layer.

Figure 4C:
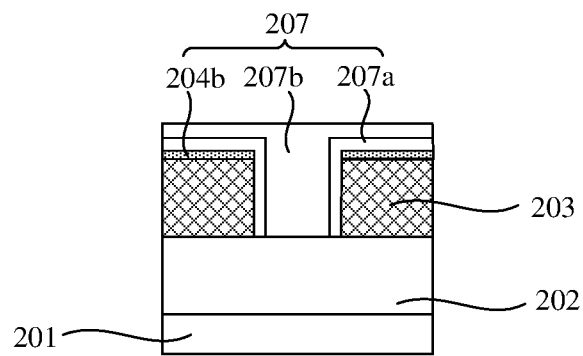
FIG. 4C is a schematic structural diagram of a semiconductor structure in a forming process provided by embodiments of the disclosure.

Referring to FIG. 4A, the protective layers 204 are corroded with the acid corrosive liquid to remove part of each protective layer to obtain remaining part of each protective layer, i.e. remaining protective layers 204b shown in FIG. 4C. Comparing FIG. 4C with FIG. 4A, it can be found that thicknesses of the protective layers (i.e. the remaining protective layers 204b) on the metal conductive layers 203 in FIG. 4C become less.

At S1052b, first dielectric layers and a second dielectric layer are formed in sequence between the metal conductive layers and on top surfaces of the remaining protective layers. The remaining protective layers, the first dielectric layers and the second dielectric layer together constitute the isolation structure.

Again, referring to FIG. 4C, the first dielectric layers 207a and the second dielectric layer 207b are formed in sequence between the adjacent metal conductive layers 203 and on the top surfaces of the remaining protective layers 204b. At this time, the isolation structure includes the first dielectric layers 207a, the second dielectric layer 207b and the remaining protective layers 204b.

During implementation, after each treatment of a chemical solution (an acid corrosive liquid or an alkaline corrosive liquid), residual chemical solution may react with a subsequent used chemical solution, for example, after a treatment with an alkaline corrosive liquid, when a treatment with an acid corrosive liquid is performed, the acid corrosive liquid may react with the alkaline corrosive liquid. In this case, after each chemical solution treatment, cleaning is needed to remove the residual chemical solution.

In some embodiments, after S1051b "the protective layers are corroded with an acid corrosive liquid to remove part of each protective layer", S1053b and S1054b may be further included.

At S1053b, a residual alkaline corrosive liquid or residual acid corrosive liquid on surfaces of remaining protective layers is cleaned out.

Here, after the by-product formed during the etching and ashing processes are removed by using the alkaline corrosive liquid, the residual alkaline corrosive liquid on the surfaces of the protective layers may be cleaned out by using deionized water, and after the part of each protective layer is removed with the acid corrosive liquid, the residual acid corrosive liquid on the surfaces of the protective layers may be cleaned out by using deionized water.

At S1054b, the metal conductive layers and the remaining protective layers are dried.

Here, after cleaning out the residual alkaline corrosive liquid or acid corrosive liquid, it is necessary to dry the metal conductive layers and the remaining protective layers to remove residual deionized water.

With the continuous reduction of a line width of semiconductor manufacture procedure, it needs to make a liquid disappear from a surface under a centrifugal force under a state of high-speed rotation in a centrifugal spin-drying process, which would increase a risk of collapse of a semiconductor structure. In the embodiments of the disclosure, in order to reduce the risk of collapse of a semiconductor structure, an isopropanol (IPA) drying process may be used to dry the metal conductive layers and the remaining protective layers. During implementation, the metal conductive layers and the remaining protective layers may be dried in a nitrogen atmosphere, which can reduce a possibility of oxygen in the air oxidizing the metal conductive layers again, thereby reducing an influence on a conductivity of the metal conductive layers.

In other embodiments, a Marangoni drying process may be used to dry the metal conductive layers and the remaining protective layers. The Marangoni drying process is essentially different from the IPA drying process, and water is pulled back to a water surface through a surface tension gradient to achieve drying in the Marangoni drying process, and water evaporation is relied on to achieve drying in the IPA drying process. Using Marangoni drying process can not only save a usage of IPA, but also overcome a difficulty of dehydration in deep and narrow ditches.

Figure 5A:
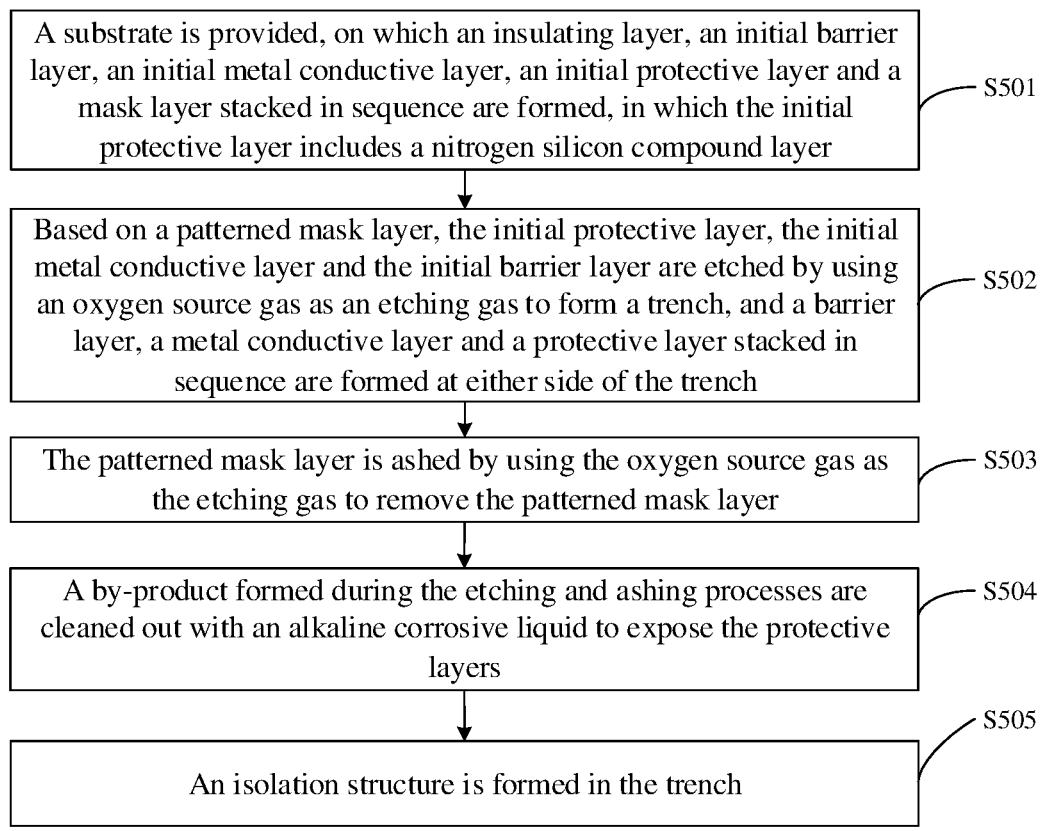
FIG. 5A is a schematic flowchart for achieving another method for forming a semiconductor structure provided by embodiments of the disclosure.

Embodiments of the disclosure also provide a method for forming a semiconductor structure, referring to FIG. 5A, the method includes S501 to S505, in which:

At S501, a substrate is provided, on which an insulating layer, an initial barrier layer, an initial metal conductive layer, an initial protective layer and a mask layer stacked in sequence are formed, in which the initial protective layer includes a nitrogen silicon compound layer.

Here, the initial barrier layer is located between the insulating layer and the initial metal conductive layer and is used for preventing a metal in the initial metal conductive layer from diffusing into the insulating layer.

At S502, based on a patterned mask layer, the initial protective layer, the initial metal conductive layer and the initial barrier layer are etched by using an oxygen source gas as an etching gas to form a trench. A barrier layer, a metal conductive layer and a protective layer stacked in sequence are formed at both sides of the trench.

At S503, the patterned mask layer is ashed by using the oxygen source gas as the etching gas, to remove the patterned mask layer.

At S504, a by-product formed during the etching and ashing processes are cleaned out with an alkaline corrosive liquid to expose the protective layers.

At S505, an isolation structure is formed in the trench.

Here, S503 to S505 may be performed with reference to S103 to S105, respectively.

S501 to S504 are further illustrated with reference to FIGS. 5B to 5H.

Figure 5B:
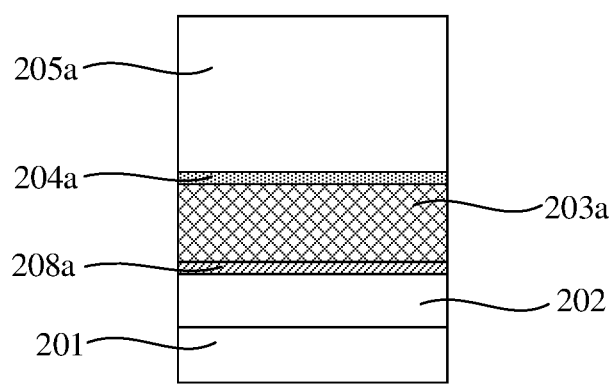
FIG. 5B is a schematic structural diagram of a semiconductor structure in a forming process provided by embodiments of the disclosure.

Referring to FIG. 5B, the insulating layer 202, the initial barrier layer 208a, the initial metal conductive layer 203a, the initial protective layer 204a and the mask layer 205a, which are stacked, are formed on the substrate 201 in sequence; in which the insulating layer 202 may be a silicon nitride layer, and the initial metal conductive layer 203a may be an initial tungsten layer, and the initial protective layer 204a may be a silicon nitride layer, and the initial barrier layer 208a may be a titanium nitride layer, and the mask layer 205a may be an amorphous carbon layer.

Figure 5C:
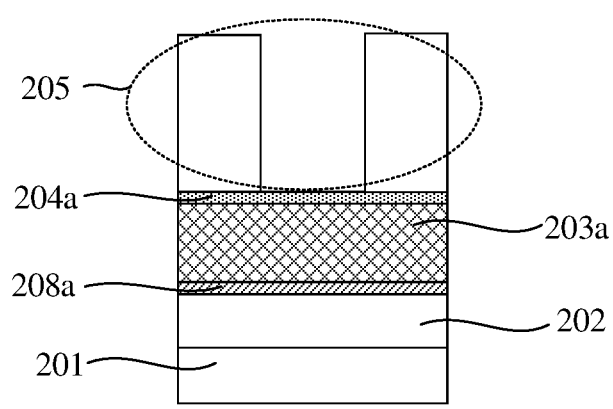
FIG. 5C is a schematic structural diagram of a semiconductor structure in a forming process provided by embodiments of the disclosure.
Figure 5D:
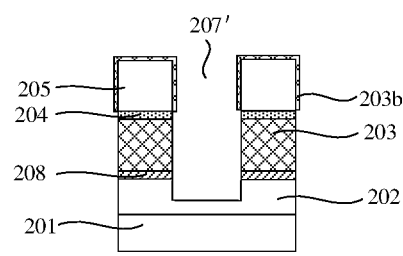
FIG. 5D is a schematic structural diagram of a semiconductor structure in a forming process provided by embodiments of the disclosure.

Referring to FIG. 5C, the patterned mask layer 205 is formed on the initial protective layer 204a. Referring to FIGS. 5C and 5D, based on the patterned mask layer 205, the initial protective layer 204a, the initial metal conductive layer 203a and the initial barrier layer 208a are etched by using the oxygen source gas as the etching gas to form the trench 207'. The barrier layer 208, the metal conductive layer 203 and the protective layer stacked in sequence are formed at both sides of the trench 207'. Here, a depth of the trench 207' is less than a sum of thicknesses of the barrier layer, the metal conductive layer, the protective layer and the insulating layer.

In some embodiments, a depth of the trench 207' may be equal to a sum of the thicknesses of the barrier layer 208, the metal conductive layer 203, and the protective layer 204, that is, when forming the trench 207', the initial protective layer 204a, the initial metal conductive layer 203a, the initial barrier layer 208a are etched, but the insulating layer 202 is not.

Figure 5E:
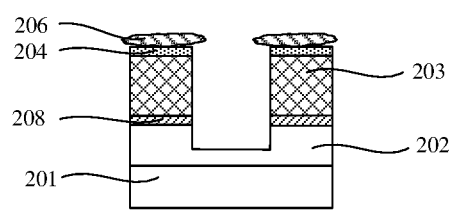
FIG. 5E is a schematic structural diagram of a semiconductor structure in a forming process provided by embodiments of the disclosure.

Referring to both FIGS. 5D and 5E, the ashing is performed by using the oxygen source gas as the etching gas to remove the patterned mask layer 205. The by-product 206 formed during the etching and the ashing process would adhere to surfaces of the protective layers 204.

Figure 5F:
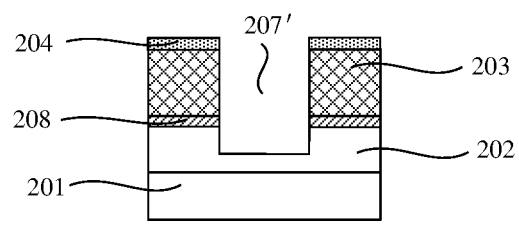
FIG. 5F is a schematic structural diagram of a semiconductor structure in a forming process provided by embodiments of the disclosure.

Referring to both FIGS. 5E and 5F, the cleaning is performed with the alkaline corrosive liquid to remove the by-product 206 formed during the etching and ashing processes to expose the protective layers 204.

Figure 5G:
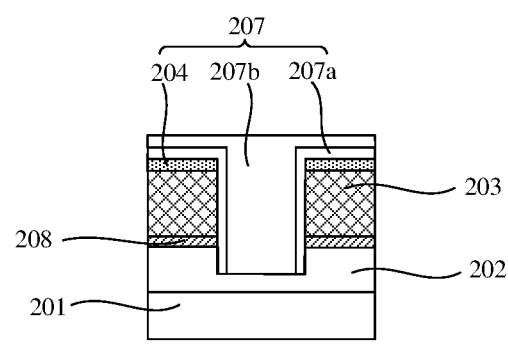
FIG. 5G is a schematic structural diagram of a semiconductor structure in a forming process provided by embodiments of the disclosure.
Figure 5H:
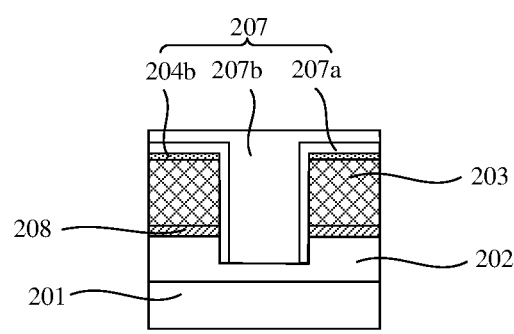
FIG. 5H is a schematic structural diagram of a semiconductor structure in a forming process provided by embodiments of the disclosure.

Referring to FIG. 5G or FIG. 5H, first dielectric layers 207a and a second dielectric layer 207b are formed on top surfaces of the protective layers 204 (or remaining protective layers 204b) and between adjacent metal conductive layers 203 to form the isolation structure 207 in the trench. The isolation structure 207 may include the first dielectric layers 207a, the second dielectric layer 207b and the protective layers 204 (or remaining protective layers 204b).

Based on the method for forming a semiconductor structure provided in S501 to S505, embodiments of the disclosure provide a semiconductor structure. Referring to FIG. 5G or FIG. 5H, an isolation structure 207 of the semiconductor structure includes: at least part of each protective layer, first dielectric layers 207a located on both sides of the metal conductive layer 203 and a second dielectric layer 207b in contact with the first dielectric layers 207a; in which the first dielectric layers 207a and the second dielectric layer 207b fill up an interspace between adjacent metal conductive layers 203.

It should be noted that the isolation structure 207 in the semiconductor structure includes at least the part of each protective layer means that the isolation structure 207 may include part of each protective layer, i.e. each remaining protective layer 204b, or may include a whole of each protective layer, i.e. each protective layer without being corroded by using an acid corrosive liquid.

In some embodiments, referring to FIG. 5H, the semiconductor structure further includes barrier layers 208 located between an insulating layer 202 and the metal conductive layers 203.

In several embodiments provided by the disclosure, it should be understood that the disclosed structures and methods may be implemented in a non-target way. The above-described device embodiments are only illustrative. For example, the division of the units is only a logical function division, and there may be other division modes in actual implementation, such as, multiple units or components may be combined or integrated into another system, or some features may be ignored or not executed. In addition, the components shown or discussed are coupled, or directly coupled to each other.

The units described above as separate components may or may not be physically separate, and components shown as units may or may not be physical units, that is, they may be located in one place or distributed to multiple network units. Some or all of the units may be selected according to actual requirements to achieve the purpose of the solution of the embodiment of the disclosure.

The features disclosed in several method or structure embodiments provided by the disclosure may be arbitrarily combined without conflict to obtain a new method embodiment or structure embodiment.

The above is only some descriptions of the embodiments of the disclosure, but the protection scope of the embodiments of the disclosure is not limited to this. Any change or replacement easily thought of by a person skilled in the art within the technical scope disclosed by the embodiments of the disclosure should be covered within the protection scope of the embodiments of the disclosure. Therefore, the protection scope of the embodiments of the present disclosure should be subject to the protection scope of the claims.

What is claimed is:

1. A method for forming a semiconductor structure, comprising:
    providing a substrate, wherein an insulating layer, an initial metal conductive layer, an initial protective layer and a mask layer stacked in sequence are formed on the substrate, and the initial protective layer comprises a nitrogen silicon compound layer;
    based on a patterned mask layer, etching the initial protective layer and the initial metal conductive layer with an oxygen source gas being used as an etching gas to form metal conductive layers and protective layers located on the metal conductive layers;
    ashing the patterned mask layer with an oxygen source gas being used as an etching gas to remove the patterned mask layer, wherein a by-product is formed during the etching and the ashing and mainly includes a metal oxide;
    cleaning out the by-product with an alkaline corrosive liquid to expose the protective layers; and
    forming an isolation structure between two adjacent ones of the metal conductive layers.

2. The method according to claim 1, wherein the initial protective layer is formed by:
    planarizing the initial metal conductive layer; and
    forming the initial protective layer on the initial metal conductive layer after planarizing,
    wherein a process for forming the initial protective layer comprises at least one of an atomic layer deposition process, a low-pressure chemical vapor deposition process or a plasma enhanced chemical vapor deposition process,
    and wherein a material of the initial metal conductive layer and the metal conductive layers comprises tungsten, and a material of the initial protective layer and the protective layers comprises at least one of silicon nitride or silicon oxynitride.

3. The method according to claim 1, wherein the mask layer comprises an amorphous carbon layer, and the based on a patterned mask layer, etching the initial protective layer and the initial metal conductive layer by using an oxygen source gas as an etching gas to form metal conductive layers and protective layers located on the metal conductive layers comprises:
    forming a patterned amorphous carbon layer on the initial protective layer; and
    based on the patterned amorphous carbon layer, etching the initial protective layer and the initial metal conductive layer by an in-situ oxygen etching process to form the metal conductive layers and the protective layers located on the metal conductive layers.

4. The method according to claim 3, wherein the ashing the patterned mask layer by using an oxygen source gas as an etching gas to remove the patterned mask layer comprises:
    ashing the patterned amorphous carbon layer with oxygen plasma to remove the patterned amorphous carbon layer.

5. The method according to claim 1, wherein the by-product formed during the etching and the ashing comprises an oxide of tungsten.

6. The method according to claim 1, further comprising:
before cleaning out the by-product formed during the etching and the ashing with the alkaline corrosive liquid to expose the protective layers, pretreating surfaces of the protective layers to remove a natural oxide on the protective layers and expose the protective layers and the by-product formed during the etching and the ashing.

7. The method according to claim 1, wherein the forming an isolation structure between two adjacent ones of the metal conductive layers comprises:
    forming first dielectric layers and a second dielectric layer in sequence between the two adjacent ones of the metal conductive layers and on top surfaces of the protective layers;
    wherein the protective layers, the first dielectric layers and the second dielectric layer together constitute the isolation structure.

8. The method according to claim 1, wherein the forming an isolation structure between two adjacent ones of the metal conductive layers comprises:
    corroding the protective layers with an acid corrosive liquid to remove part of each of the protective layers; and
    forming first dielectric layers and a second dielectric layer in sequence between the two adjacent ones of the metal conductive layers and on top surfaces of remaining protective layers, wherein the remaining protective layers, the first dielectric layers and the second dielectric layer together constitute the isolation structure.

9. The method according to claim 8, further comprising: after corroding the protective layers with the acid corrosive liquid to remove the part of each of the protective layers,
    cleaning out a residual alkaline corrosive liquid or a residual acid corrosive liquid on surfaces of the remaining protective layers; and drying the metal conductive layers and the remaining protective layers.

10. The method according to claim 9, wherein the metal conductive layers and the remaining protective layers are dried with isopropanol and nitrogen.

11. The method according to claim 9, wherein the alkaline corrosive liquid comprises an ammonia diw mixture solution, and a volume ratio of ammonia to deionized water in the ammonia diw mixture solution ranges from 5:1 to 1000:1, and the acid corrosive liquid comprises a diluted hydrofluoric acid solution, and a volume ratio of hydrogen fluoride to deionized water in the diluted hydrofluoric acid solution ranges from 10:1 to 1000:1.

12. The method according to claim 1, wherein an initial barrier layer between the insulating layer and the initial metal conductive layer is further formed on the substrate,
   wherein the based on a patterned mask layer, etching the initial protective layer and the initial metal conductive layer by using an oxygen source gas as an etching gas to form metal conductive layers and protective layers located on the metal conductive layers comprises: based on the patterned mask layer, etching the initial protective layer, the initial metal conductive layer and the initial barrier layer by using the oxygen source gas as the etching gas to form a trench, and forming a barrier layer, a metal conductive layer and a protective layer stacked in sequence at both sides of the trench,
   and wherein the forming an isolation structure between two adjacent ones of the metal conductive layers comprises: forming the isolation structure in the trench.

\* \* \* \* \*